United States Patent [19]
Rodgers

[11] 3,975,221
[45] Aug. 17, 1976

[54] LOW CAPACITANCE V GROOVE MOS NOR GATE AND METHOD OF MANUFACTURE

[75] Inventor: Thurman J. Rodgers, Palo Alto, Calif.

[73] Assignee: American Micro-Systems, Inc., Santa Clara, Calif.

[22] Filed: Aug. 29, 1975

[21] Appl. No.: 608,984

Related U.S. Application Data

[62] Division of Ser. No. 392,668, Aug. 29, 1973, Pat. No. 3,924,264.

[52] U.S. Cl. ............... 148/191; 148/175; 148/187; 148/1.5; 357/23; 357/41; 357/55; 29/571

[51] Int. Cl.² ............... H01L 7/34; H01L 7/36; H01L 7/54

[58] Field of Search ............ 148/175, 187, 191, 1.5; 357/23, 41, 55; 29/571

[56] References Cited
UNITED STATES PATENTS

| | | | |
|---|---|---|---|
| 3,355,598 | 11/1967 | Tuska | 317/235 B |
| 3,412,297 | 11/1968 | Amlinger | 317/235 B |
| 3,414,740 | 12/1968 | Dailey et al. | 317/235 B |
| 3,518,509 | 6/1970 | Cullis | 317/235 B |
| 3,751,722 | 8/1973 | Richman | 357/41 |
| 3,752,711 | 8/1973 | Kooi | 357/52 |
| 3,761,785 | 9/1973 | Pruniauy | 317/235 B |
| 3,764,396 | 10/1973 | Tarui et al. | 148/187 X |
| 3,823,352 | 7/1974 | Pruniauy et al. | 357/23 |

Primary Examiner—G. Ozaki
Attorney, Agent, or Firm—Owen, Wickersham & Erickson

[57] ABSTRACT

An MOS transistor is provided having a surface diffused drain and a common substrate source. A heavily doped base layer and a lightly doped space charge region are provided between the drain and source regions. The gate is formed on the inclined surface of a V groove which penetrates into the transistor to the substrate exposing the base layer to the gate structure. The gate is formed in the V groove by a silicon oxide insulative layer and conductive layer. Appropriate leads contact the gate conductor and the drain.

13 Claims, 16 Drawing Figures

STEP B
DRAIN FORMATION

ALTERNATIVE B-1
SELECTIVE OXIDATION (a) GROW TEMPORARY SiO$_2$ LAYER (b) GROW TEMPORARY Si$_3$N$_4$ LAYER (c) ETCH TO DEFINE DRAIN AREA (DRAIN MASK)

(d) FORM CHANNEL PREVENTION P SURFACE LAYER (e) ETCH UNDERCUT IN SiO$_2$ LAYER (f) FORM FIELD SiO$_2$ 30

(g) ETCH TEMPORARY Si$_3$N$_4$ AND SiO$_2$ LAYERS (h) N+ DRAIN DIFFUSION

ALTERNATIVE B-2
STRAIGHT DIFFUSION (a) FORM CHANNEL PREVENTION P SURFACE LAYER (b) FORM FIELD SiO$_2$ 30

(c) DEFINE DRAIN 20 AREA (DRAIN MASK)

FIGURE 5B SHOWS CHIP 10 WITH DRAIN 20 AND FIELD OXIDE 30 AFTER STEP B COMPLETION

LOW CAPACITANCE V GROOVE MOS NOR GATE AND METHOD OF MANUFACTURE

This application is a division of parent application Ser. No. 392,668 filed Aug. 29, 1973, now U.S. Pat. No. 3,924,265 and entitled "LOW CAPACITANCE V GROOVE MOS "NOR" GATE AND METHOD OF MANUFACTURE" and claims the benefit of the filing date of the parent application.

FIELD OF THE INVENTION

This invention relates to V groove transistors and more particularly to such transistors that have a low capacitance and are of minimum size.

BACKGROUND OF THE INVENTION

Figure 1:
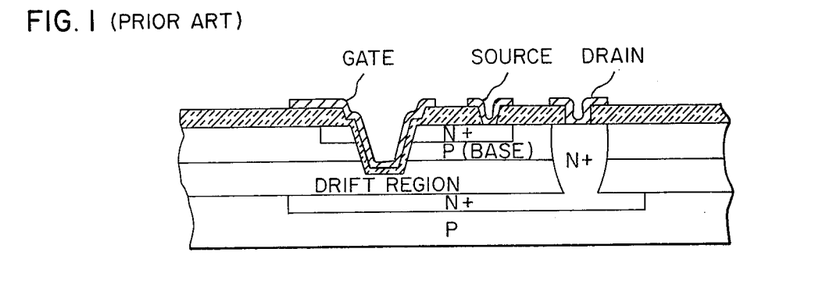
FIG. 1 is a sectional view showing the prior art V-groove MOS transistor developed by Tarui, et al.

V groove MOS transistors are described by Y. Tarui, et al in an article entitled "Diffusion Self-Aligned MOST: a New Approach for a High Speed Device" appearing in the Proceedings of the First Conference on Solid State Devices, Tokyo, 1969. The Tarui device, shown in FIG. 1, is formed by a surface diffused n-type source and a buried n-type drain spaced thereunder. Electrical contact is made to the buried drain by an n-type diffused column. A p-type high conductivity base layer and a p-type low conductivity space charge region (shown as a drift region in FIG. 1) are provided between the source and the drain. Appropriate lead contacts are made along the top of the device to the gate, source, and drain elements. The Tarui prior art device has several notable drawbacks. First, the area required to provide surface lead contacts to the three elements takes up by far the majority of the chip surface area. Each of these three conductive leads occupies a terminal space immediately above each element, and also a conducting path space, across the surface of the chip to another device or circuit. Secondly, the buried drain and diffused drain contact are awkward to form with present industrial practices, and may increase the internal resistance of the Tarui device. Thirdly, a high drain-to-substrate capacitance is created by the heavily doped n-type drain immediately adjacent to the p-type substrate. This critical capacitance is further increased by the large interface between the drain and the substrate and the drain and the space charge region.

SUMMARY OF THE INVENTION

It is therefore an object of this invention to provide a V-groove MOS transistor having a lower capacitance and a smaller size and which is cheaper and simpler to manufacture.

It is another object of this invention to provide a series of V-groove MOS transistors having a common source which forms the substrate.

It is a further object of this invention to provide a V-groove MOS transistor in which the heavily doped base layer is not placed adjacent to the heavily doped surface diffused region, and in which the drain has a smaller interface with the remainder of the device.

It is still a further object of this invention to provide a "NOR" logic circuit employing V-groove MOS transistors with multiple gates.

Briefly these and other objects are accomplished by providing a n-doped common source on which is formed a p-doped base region and a plurality of n-doped drains. Etched V-grooves traverse the base and each of the drains exposing an edge area of each. The maximum base and drain edge area is produced in the V-groove side wall when the V-groove extends generally through the center of the drain and a perimeter is formed on the V-groove side walls by the drain edge area and by the base edge area. A gating electrode is provided on the V-groove side walls over the edge area by an insulative layer with a conductive layer thereover. During operation, voltages are applied to the device which establish an inversion region across the base area for controlling the source-drain current. The device is unconventionally small in size, and consequently low in interelement capacitance because the common source feature eliminates the source lead and terminal structure requirement on the device surface. The drain capacitance is further minimized by the small drain to base interface. The drain is diffused from one side of the device and hence interfaces the remainder of the device along its inner side. Drain formation by diffusion is a convenient technique which does not involve a contact column.

BRIEF DESCRIPTION OF THE DRAWINGS

These and other objects and advantages of the present transistors and the operation and method of manufacturing thereof will become apparent by studying the following detailed description and drawing in which:

FIG. 4A-E shows flow charts for each major step A-E of the method of making the present V groove device;

FIG. 5A-D shows the progressive construction of the present V groove device at the completion of each major step of FIG. 4.

DETAILED DESCRIPTION OF AN EMBODIMENT

Figure 2:
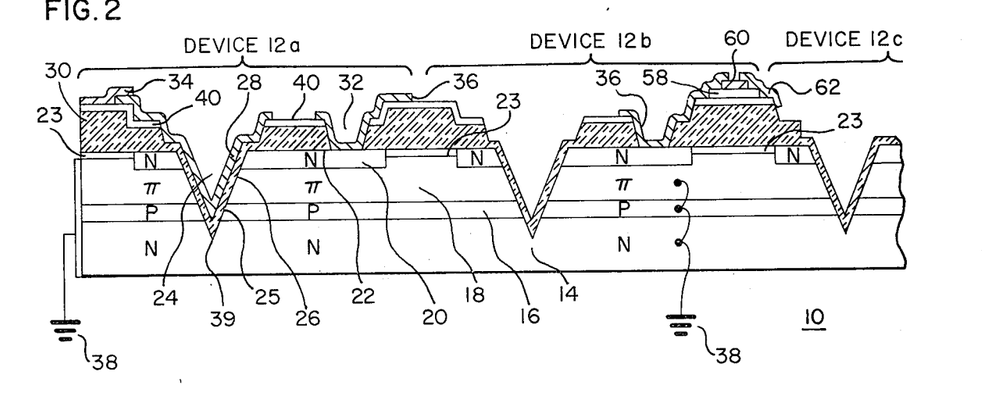
FIG. 2 is a sectional view showing the preferred embodiment of the present V groove device.

FIG. 2 shows the preferred embodiment of the present V groove MOS invention showing chip or wafer 10 having several transistor devices 12 a, b, and c formed thereon. Transistor devices 12 are formed on an n-type doped common source 14 which may form the substrate to chip 10. A p-type base layer 16 is formed immediately over common source 14. A space charge or drift region 18 covers base 16. N-doped drain regions 20 are diffused into drift region 18 from the surface 22 of chip 10. The remainder of surface 22 is p-doped to form a channel stopping layer 23 for preventing a surface silicon oxide from forming a conductive inversion layer in drift region 18. A V groove 24 is provided into chip 10 traversing drain 20, drift region 18, base 16, and preferably a portion of common substrate 14. V groove 24 exposes edge 25 of base 16 for gate formation. A silicon oxide film 26 of the appropriate thickness is provided within V groove 24 over which is formed conductor material 28. Silicon oxide 30 is provided over chip surface 22. A contact aperture 32 is etched for providing electrical contact to drain 20. Gate lead 34 and drain lead 36 are formed over surface silicon oxide 30 for appropriate connection of device 12 into an electrical circuit. Preferably, common source 14 is grounded in an electrical communication with base 16 and drift region 18 as shown at reference numeral 38. A silicon nitride barrier layer 40 may be provided over surface silicon oxide 30. In usual operation, source 14 is grounded and positive voltages are applied to drain lead 36 and gate lead 34. The positive voltage on gate conductor 28 induces an n-type inversion region in p base 16 along edge 25. Current then flows through drain 20, drift across the depleted drift region 18, flow along the inversion region along surface 25 and into source substrate 14. Thus, a positive gate voltage causes current to flow between drain 20 and source 14. In a logic sense, device 12 behaves like a voltage-controlled switch.

Common source or substrate 14 is typically n-doped over a range from about $10^{17}$ to about $5 \times 10^{19}$. Antimony is the preferred dopant because it has a lower diffusion coefficient and exhibits low auto-doping during epitaxial deposition. However, other n-type dopants such as arsenic may be employed. Dopant levels below the typical range could be employed. However, at lower dopant levels, the series spreading resistance in substrate 14 becomes more noticeable. Dopant levels higher than the typical range may also be employed; in which case auto-doping becomes more noticeable. Substrate 14 is typically from 100 microns to 250 microns in thickness which is adequate for mechanical support of chip 10. If other means of support are employed, such as in dielectric isolation and silicon sapphire techniques, substrate 14 may be considerably thinner and still maintain its electrical viability. Base 16 is typically about 1 micron or less in thickness. It is desirable to provide a thin base 16 because the gain of transistor 12 is inversely proportional to the thickness of base 16. At extremely thin thicknesses, this gain versus thickness relationship deteriorates, and low voltage drain-to-source punch through may occur. The preferred p-dopant in base 16 is boron, at a concentration of about $5 \times 10^{16}$. Drift region 18 thickness is typically from ½ to 1 micron and is lightly boron doped to establish a resistivity from 5 to about 20 ohms-cm. Lower resistivities may be employed, but they will increase the resistivity of drift region 18 producing series parasitic resistances which degrade the low level logic performance. The purpose of drift region 18 is to prevent the entire drain-to-source voltage from appearing across base 16, thus permitting base 16 to be thinner without electrical breakdown. Drain 20 typically has a thickness from about ½ to about 1 micron and a dopant gradiant with a concentration at surface 22 equal to the solid solubility limit. Many n-type dopants are suitable for drain 20, but n-dopants phosphorus and arsenic are preferred because of high solid solubility in silicon.

V-groove 24 is etched into chip 10 using conventional silicon etching techniques described by D. B. Lee in an article entitled "Anisotropic Etching of Silicon" appearing in the Journal of Applied Physics, Vol. 40, No. 11, October 1965, pages 4569 to 4574; and further described by R. M. Finne and E. L. Klein in an article entitled "A Water Amine Complexing Agent System for Etching Silicon" appearing in the Journal of the Electrochemical Society, Solid State Science, September, 1967, pages 965 to 970. The V shape is produced by the particular etchant selected and the crystal orientation of the silicon within chip 10. Anisotropic etchants have a low rate of attack on (111) planes and a high attack rate on (100) planes. The depth of the groove, the ultimate position of the V groove apex 39, is determined by the surface or etching aperture dimensions. Gate silicon oxide 26 is typically from about 500 to about 1000 Angstroms thick. A thin film is preferred here because the gain of transistor 12 is inversely proportional to the thickness of gate silicon oxide 26. The use of thinner gate oxides results in pinholes and reduced production yields. Thicker gate oxides may be employed at a sacrifice of gain. Conductive material 28 is typically 1000 – 7000 Angstroms in thickness and is highly n-doped polysilicon, preferably doped to the limit of the material. Doped polysilicon is preferred as gate conductor 28 primarily because gate oxide 26 can be covered immediately after formation by polysilicon, whereas there must be an intervening photolithographic step to etch contact aperature 32 if gate conductor 28 is a metal. Moreover, polysilicon gates offer contamination protection which common aluminum or other metallic gates do not. Metals such as aluminum may be evaporated over gate silicon oxide 26 and function as the conductive lead to gate 28. Silicon barrier 40 for preventing sodium penetration is typically from about 100 to 1000 Angstroms thick. Thinner barriers may be employed but layer 40 becomes less impervious to contamination. Thicker layers may also be employed but become difficult to etch.

Figure 3:
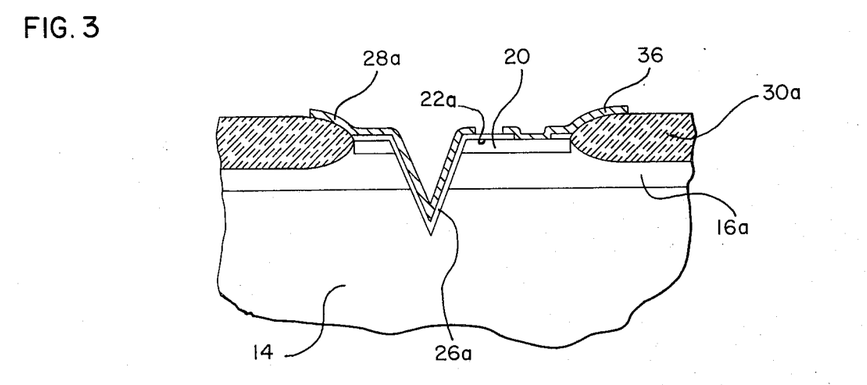
FIG. 3 shows the modification of the preferred FIG. 2 embodiment formed by the selective oxidation technique without the barrier layer 40 or drift region 18 of FIG. 2.
Figure 5A:
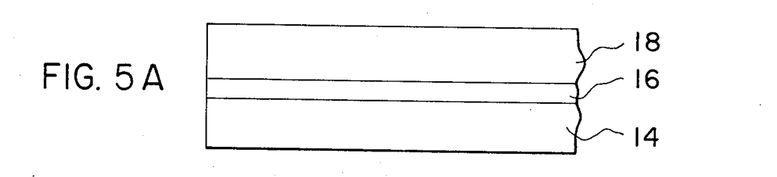
Figure 5B:
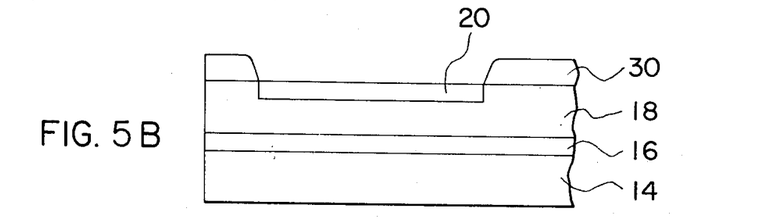
Figure 5C:
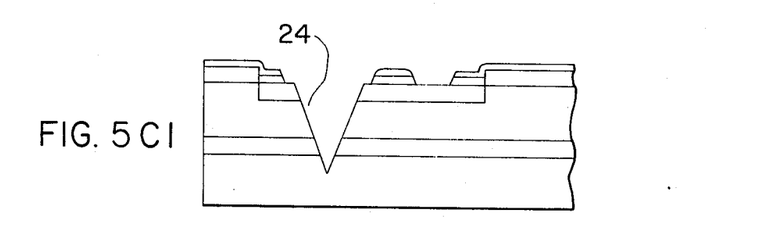
Figure 5C:
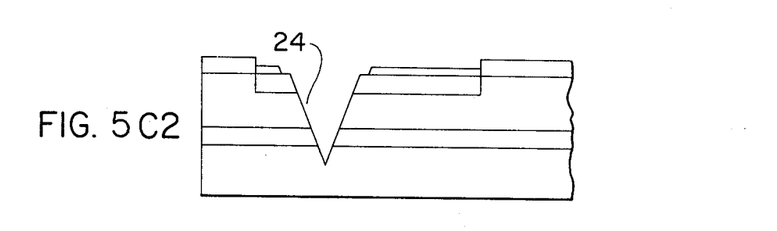
Figures 5C, 5D:
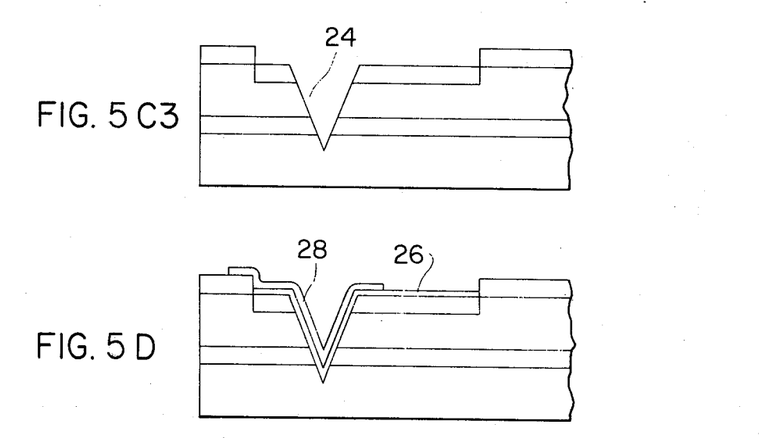

FIG. 3 shows a low voltage embodiment of FIG. 2 in which space charge region 18 has been eliminated and the entire drain-to-source voltage appears across base 16a in FIG. 3. Base 16a must be somewhat thicker than base 16 in FIG. 2 to withstand the full drain-to-source voltage. Alternatively, a lower drain-to-source voltage may be employed in FIG. 3 permitting a thin base 16a and a gain equivalent to the FIG. 2 embodiment. Field oxide 30a in FIG. 3 is formed by the selective oxidation technique (discussed in detail in connection with FIG. 5) in which silicon oxide is grown in all areas except those masked by silicon nitride. This technique produces silicon oxide which is approximately one half above and one half below the masked silicon surface as opposed to ordinary oxidation which produces silicon oxide entirely atop the silicon surface. This technique is favored because the oxide steps are tapered and smaller, and may be readily covered by aluminum metal.

The thicker field oxide 30a reduces the capacitance between the elements of the FIG. 3 device and chip surface 22a. Further, field oxide 30a renders chip 10 less sensitive to fatal masking defects resulting in a higher yield. Channel stopping layer 23 is not required when drift region 18 is not employed. Silicon oxide 30a is adjacent to the high p-type doped base 16a rather than the low doped region 18, and the inversion effect of field silicon oxide 30a is insufficient to overcome the higher p doping. N-type conductive inversion layers do not form in highly doped base 16a.

FIG. 4A-E shows flow charts illustrating the major steps A-E and the preferred alternatives (numbered columns) and substeps (small case letters) within each major step. Each major step, alternative, and substep is supplemented by working instructions given in the following pages.

FIG. 5A-D shows the state of construction of chip 10 after completion of each major step A-D described in the flow charts of FIG. 4A-E.

Figure 4A:
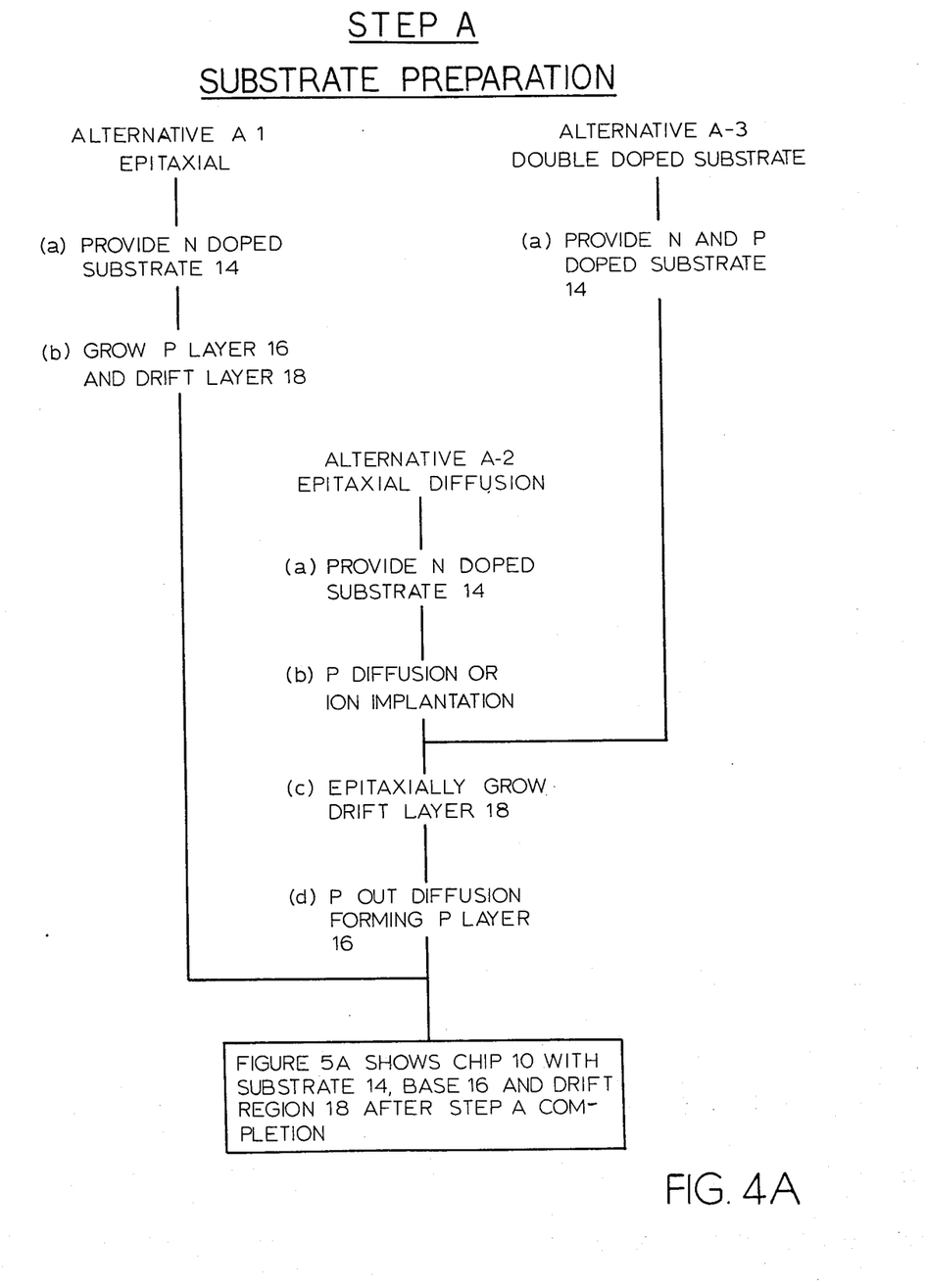

Working Instructions for Step A of FIG. 4A

A-1a: The starting material is antimony-doped (100) silicon of 0.01 $\Omega$-cm resistivity.

A-2a: Same as A-1a.

A-3a: The starting material is as in A-1a; but also boron doped to $10^{17}$ atoms/cm$^3$.

A-1b: Standard epitaxial deposition is done by the Pyrolysis of SiH$_4$ in hydrogen at 1050°C. The growth rate is 0.25 microns/minute. The p layer is 1 micron thick and 0.50 Ω-cm. The drift layer is 2 microns thick and 20 Ω/cm.

A-2b: Standard solid-solubility boron diffusion is done by the reaction of B$_2$H$_6$ and oxygen in a nitrogen atmosphere. The sheet resistivity after predeposition is 90 Ω/square. The heat cycle is 30 minutes at 900°C. The drive-in diffusion is done for 3 hours at 1250°C.

Alternately, standard ion implantation conditions produce a dose of $10^{15}$ boron ions/cm$^2$ at an energy of 50keV.

A-2c: Same as A-1b. The drift epitaxial layer here is 3 microns thick and 20 Ω-cm in resistivity.

A-2d: A heating step done in a nitrogen atmosphere. The time is 30 minutes at 1100°C.

Figure 4B:
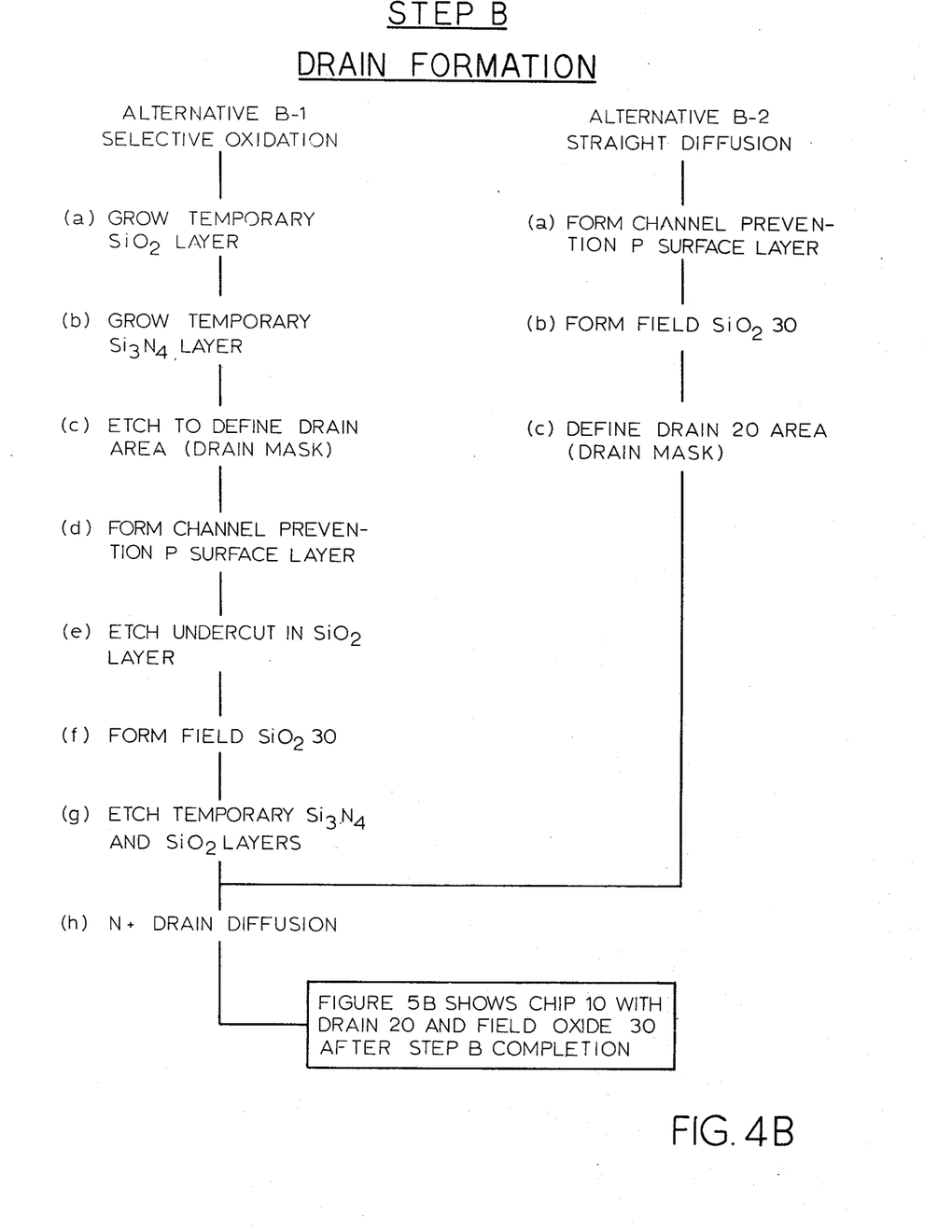

Working Instructions for Step B of FIG. 4B

B-1a: Standard growth of a thermal oxide is done in a dry O$_2$ — wet O$_2$ — dry O$_2$ atmosphere for 10 minutes, 17 minutes, 10 minutes respectively. The temperature is 950°C.

B-1b: Standard silicon nitride (epitaxial) deposition is performed by the reaction of SiH$_4$ and NH$_3$ at 950°C in a hydrogen atmosphere. The growth rate is 200 Angstroms/minute.

B-1c: The standard silicon nitride etch is phosphoric acid at 180°C. The etch rate is 100 Angstroms/minute. Buffered hydrofluoric acid is used to etch silicon oxide with the silicon nitride serving as a mask.

B-1d: Same as A-2b: The diffusion is 30 minutes at 900°C.

B-2a: Same as B-1d.

B-1e: Buffered hydrofluoric acid is used as the standard silicon oxide etch at a rate of 1000 Angstroms/minute.

B-1f: Same as B-1a: with cycle 10 minutes — 7 hours — 10 minutes at 950°C.

B-2b: Same as B-1f.

B-1g: Same as B-1c and B-1e.

B-2c: Standard photoresist technique with buffered HF etch at 1000 Angstroms/minute (B-1e).

B-1h: Standard predeposition of phosphorus in silicon is performed in a furnace with POCl$_3$ source. The cycle is 30 minutes at 975°C.

This diffusion may also be performed from a phosphorus-doped silicon oxide source.

Figure 4C:
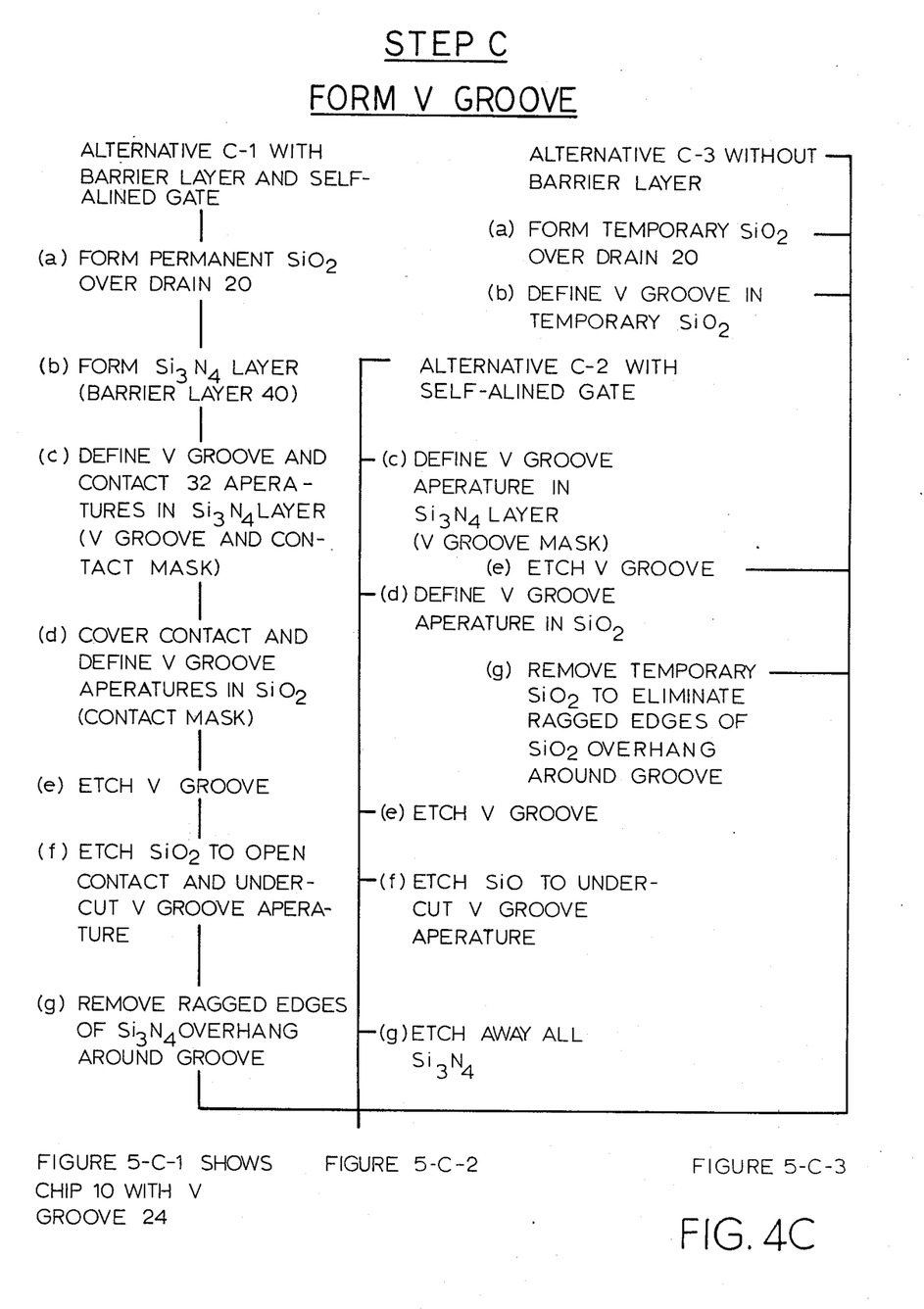

Working Instructions for Step C of FIG. 4C

C-1a: Same as B-1a with cycle 10 minutes — 90 minutes — 10 minutes at 900°C. This oxidation may be better done by epitaxial deposition of 4000 Angstroms of silicon oxide. Conditions are the same as in the silicon nitride deposition (item 10), but NH$_3$ there is replaced by N$_2$O here.

C-3a: Same as C-1a.

C-1b: Same as B-1b.

C-1c: Same as B-1c.

C-2c: Same as B-1c.

C-1d: Same as B-1h.

C-2d: Same as B-1h.

C-3b: Same as B-1h.

C-1c: Same as B-1c. The anisotropic etch is performed for 7 minutes in a solution of 70% (volume) N$_2$H$_4$ and 30% H$_2$O at 100°C.

C-2c: Same as C-1c.

C-3c: Same as C-1c.

C-1f: Same as B-1c time 10 minutes.

C-2f: Same as B-1c.

C-1g: Same as B-1c.

C-2g: Same as B-1c.

C-3g: Same as B-1c.

Figure 4D:
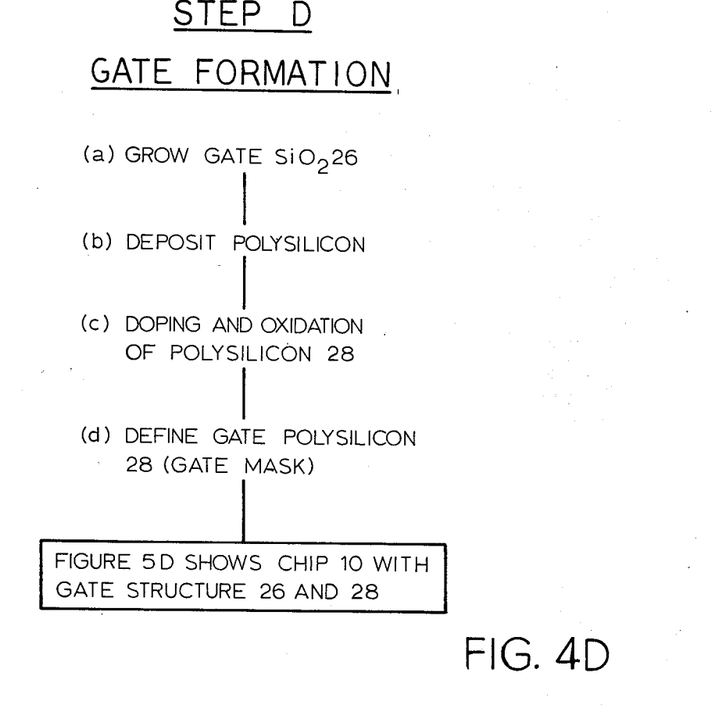

Working Instructions for Step D of FIG. 4D

D-a: Same as B-1a with cycle 10 minutes — 10 minutes — 10 minutes at 950°C.

D-b: Standard polysilicon (epitaxial) deposition is performed in a hydrogen ambient by the pyrolysis of SiH$_4$ at 950°C. The growth rate is 0.1 microns/minute. Phosphorus diffusion is done in 15 minutes at 950°C (B-1h).

D-c: Same as C-1a. Cycle 15 minutes at 950°C. Oxidation as in B-1a. Cycle 10 minutes — 10 minutes — 10 minutes at 950°C. The last 10 minute cycle is performed in dry nitrogen as opposed to dry oxygen.

D-d: Standard photoresist techniques define the pattern in the silicon oxide on top the polysilicon. The polysilicon etch is 10 parts (volume) of 40% (weight) NH$_4$F solution to 1 part concentrated nitric acid. The oxide defined serves to mask the polysilicon etch.

Figure 4E:
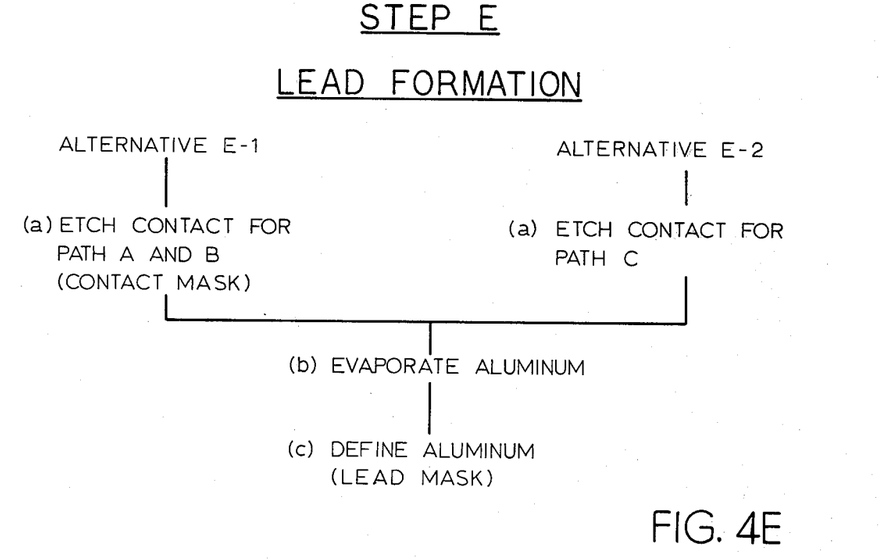

Working Instructions for Step E of FIG. 4E

E-1a: Same as B-1c.

E-2a: This silicon oxide etch is done unmasked in a solution 10 parts H$_2$O (volume) to 1 part HF. The time is 3 minutes at an etch rate of 300 Angstroms/minute.

E-1b: Standard aluminum evaporation of 1 micron in thickness.

E-1c: Photolithographic protection of aluminum is done with standard negative resist techniques. The aluminum etch is 16 parts (volume) of H$_3$PO$_4$, 1 part HNO$_3$, and 1 part H$_2$O. The etch rate is 0.5 microns/minute.

Figure 6A:
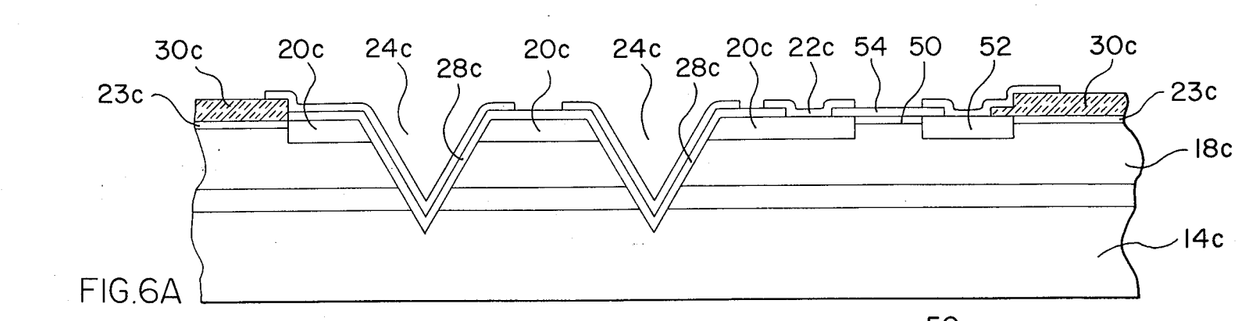
FIG. 6A and B is a schematic diagram showing a fundamental "NOR" logic circuit formed by a present invention with common sources.
Figure 6B:
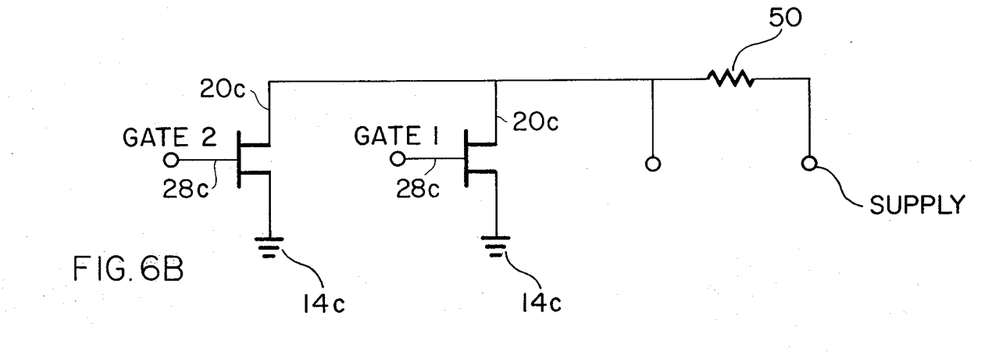

FIG. 6A shows a fundamental "NOR" logic device having two input gates formed by two V grooves 24c etched thorugh drain 20c on a single device. Gates 28c have a common drain 20c and a common source 14c as shown in FIG. 6B which is a schematic diagram of a two gate "NOR" circuit. An input in either gate 28c will turn the device on, "shorting" drain 20c to common source 14c. Any number of gates 28c may be formed in the device merely by making drain 20c longer or wider to increase its area and etching more V-grooves 24c. A series of these "n" input "NOR" gates can produce all expressions in the Boolean logic system. Further, decoders of the "one of n" type require multiple gate devices. A three digit binary decoder requires eight three gate "NOR" circuits, or four gate "NOR" circuits if an enabling provision were required. A two-level one of 256 decoder requires 256 eight input "NOR" gates.

In the NOR gate of FIG. 6A, a load resistor 50 is formed within drift region 18c of the device 12 just beneath surface 22c between drain 20c and a contact well 52. Resistor 50 may be formed by implanting n-type ions into drift region 18c prior to formation of the surface silicon oxide 54. Ion implanted resistances of thousands of ohms/square may be readily provided, in contrast to the typical drain resistances of about 10–50 ohms/square. Alternatively, load resistor 50 may be formed by diffusion of n-dopants. Preferably, silicon oxide 54 is lightly n-doped; and during the subsequent diffusion step, the n-dopant diffuses into drift region 18c to form resistor 50. During the same diffusion step boron dopant provided in field oxide 30c may be diffused into drift region 18c thereunder to form channel stopping layers 23c. Contact well 52 may be n-doped and may be formed simultaneously with drain 20c. The load resistor may also be a polysilicon resistor 58 (as shown in FIG. 2) which does not require a contact well. A polysilicon bar 58 is formed on barrier layer 40 and overcoated with insulation layer 60 leaving the end portions of bar exposed. The exposed ends form good ohmic contact with drain lead 36 and a voltage supply lead 62 which are subsequently formed.

The objects of this invention have been achieved by providing a surface diffused drain having a smaller interface area with the base and drift regions. The common source approach eliminates individual source leads and terminal structures. The surface of the present device is only required to provide room for the gate and drain contacts. As a result, the devices may be placed closer together increasing both compactness and yield.

The structure and operation of each embodiment herein is for illustration of the present inventive concept, and the appended claims should not be limited thereto. The spirit and scope of the invention is broader than the presented detailed enabling disclosure. Further, the specific features of each embodiment may be combined with the other embodiments and the specific features thereof.

I claim as my invention:

1. A method of making a field effect transister device, comprising the steps of:
   providing a semiconductor crystal source substrate having donor and acceptor dopants in which the acceptor concentration is less than the donor dopant concentration;
   forming a drift region over the source substrate having a dopant concentration less than the acceptor dopant concentration of the source substrate;
   out diffusing acceptor dopant from the source substrate into the drift region to form a p-type base means;
   forming n-type drain means in the drift region;
   etching at least one V groove into the source substrate exposing portions of the base means and drift region;
   providing insulative material over the exposed portions to form a gate oxide;
   providing conductive material over the insulation material to form a gate electrode; and
   providing lead means in electrical communication with the base means and drain means.

2. The method of claim 1 wherein the donor dopant in the source substrate is antimony or arsenic.

3. The method of claim 1 wherein the donor dopant in the source substrate is antimony.

4. The method of claim 1 wherein the donor dopant in the substrate is antimony at a concentration of from about $10^{17}$ to about $5 \times 10^{19}$ atoms per cubic cm.

5. The method of claim 4 wherein the drift region is lightly p doped.

6. The method of claim 4 wherein the acceptor dopant is diffused into the source substrate.

7. The method of claim 4 wherein the acceptor dopant is ion implanted into the source substrate.

8. The method of claim 4 wherein the acceptor dopant and donor dopant are incorporated into the source substrate during the crystal growth of the source substrate.

9. The method of claim 4 wherein the drift region is epitaxially grown over the source substrate.

10. The method of claim 4 wherein the out diffusion proceeds at a predetermined temperature for a predetermined time.

11. The method of claim 10 wherein the acceptor dopant has a greater diffusion coefficient at the out diffusion temperature than the donor dopant.

12. The method of claim 1 wherein the acceptor dopant concentration in the source substrate is less than the donor dopant concentration in the source substrate along the surface of the source substrate proximate the drift region.

13. The method of claim 1 additionally comprising:
   forming field insulation over the drift region prior to forming the n type drain means;
   selectively removing the field insulation to define drain means sites;
   diffusing donor dopant through the drain means sites during the drain formation step to form the drain means; and
   depositing conductive material over the field insulation to form lead means.

* * * * *

UNITED STATES PATENT AND TRADEMARK OFFICE
CERTIFICATE OF CORRECTION

PATENT NO. : 3,975,221

DATED : August 17, 1976

INVENTOR(S) : THURMAN J. RODGERS

It is certified that error appears in the above-identified patent and that said Letters Patent are hereby corrected as shown below:

Col. 2, line 40, after "Fig. 6A and B" insert --is a section view and--. Col. 4, line 20, after "Silicon" insert --nitride--. Col. 6, line 45, "thorugh" should read --through--.

Signed and Sealed this

Twenty-sixth Day of April 1977

[SEAL]

Attest:

RUTH C. MASON
*Attesting Officer*

C. MARSHALL DANN
*Commissioner of Patents and Trademarks*